(12) United States Patent
Barlow

(10) Patent No.: US 9,250,126 B2
(45) Date of Patent: Feb. 2, 2016

(54) OPTICAL SENSING ELEMENT ARRANGEMENT WITH INTEGRAL PACKAGE

(71) Applicant: Excelitas Technologies GmbH & Co. KG, Wiesbaden (DE)

(72) Inventor: Arthur John Barlow, Alton (GB)

(73) Assignee: Excelitas Technologies Singapore PTE. Ltd, Singapore (SG)

(*) Notice: Subject to any disclaimer, the term of this patent is extended or adjusted under 35 U.S.C. 154(b) by 501 days.

(21) Appl. No.: 13/661,274

(22) Filed: Oct. 26, 2012

(65) Prior Publication Data
US 2014/0117201 A1     May 1, 2014

(51) Int. Cl.
| | |
|---|---|
| *G01J 5/02* | (2006.01) |
| *G01J 1/46* | (2006.01) |
| *G01J 1/42* | (2006.01) |
| *H05K 13/00* | (2006.01) |
| *H05K 13/04* | (2006.01) |
| *H05K 3/32* | (2006.01) |
| *G01J 5/04* | (2006.01) |
| *G01J 5/20* | (2006.01) |
| *G01J 5/24* | (2006.01) |
| *G01J 5/08* | (2006.01) |

(52) U.S. Cl.
CPC .... *G01J 1/46* (2013.01); *G01J 1/42* (2013.01); *G01J 5/0205* (2013.01); *G01J 5/029* (2013.01); *G01J 5/04* (2013.01); *G01J 5/045* (2013.01); *G01J 5/046* (2013.01); *G01J 5/0806* (2013.01); *G01J 5/20* (2013.01); *G01J 5/24* (2013.01); *H05K 3/32* (2013.01); *H05K 13/0046* (2013.01); *H05K 13/04* (2013.01); *Y10T 29/49128* (2015.01); *Y10T 29/49146* (2015.01); *Y10T 29/49826* (2015.01)

(58) Field of Classification Search
CPC ...................................... G01J 5/02; G01J 5/04
USPC ................ 250/239, 338.1, 338.3, 338.4, 352
See application file for complete search history.

(56) References Cited

U.S. PATENT DOCUMENTS

| | | | |
|---|---|---|---|
| 4,986,672 A | 1/1991 | Beynon | |
| 5,021,663 A | 6/1991 | Hornbeck | |
| 5,693,942 A | 12/1997 | Endo et al. | |
| 6,348,650 B1 | 2/2002 | Endo et al. | |
| 6,694,800 B2 | 2/2004 | Weckstrom | |
| 6,710,348 B1 | 3/2004 | Rothley et al. | |
| 6,755,031 B2 * | 6/2004 | Cho et al. ......... | 62/126 |
| 6,964,515 B2 | 11/2005 | Asakura et al. | |
| 7,040,806 B2 | 5/2006 | Ishikawa et al. | |
| 7,276,697 B2 | 10/2007 | Devine | |
| 7,362,224 B2 | 4/2008 | Zambon | |
| 7,842,922 B2 | 11/2010 | Leneke et al. | |
| 7,985,953 B2 | 7/2011 | Luterotti et al. | |
| 8,158,943 B2 | 4/2012 | Kryskowski | |
| 8,592,765 B2 * | 11/2013 | Forg et al. ................. | 250/338.1 |
| 2003/0222218 A1 | 12/2003 | Nozu | |

(Continued)

*Primary Examiner* — Kevin Pyo
(74) *Attorney, Agent, or Firm* — Peter A. Nieves; Sheehan Phinney Bass + Green PA

(57) ABSTRACT

A sensor assembly is disclosed that includes a hollow casing having a radiation entrance opening. A radiation-transmissive optic is at the radiation entrance opening. A substrate is inside and sealed against the hollow casing. An optical sensing element is coupled to the substrate and configured to sense radiation that has passed through the radiation-transmissive optic. A method of manufacturing the sensor assembly also is disclosed.

35 Claims, 15 Drawing Sheets

(56) References Cited

U.S. PATENT DOCUMENTS

| | | |
|---|---|---|
| 2004/0031924 A1* | 2/2004 | Cho et al. .............. 250/353 |
| 2004/0066832 A1 | 4/2004 | Lin et al. |
| 2004/0079888 A1 | 4/2004 | Inamura |
| 2004/0109490 A1 | 6/2004 | Asakura |
| 2004/0187904 A1 | 9/2004 | Krellner et al. |
| 2005/0179102 A1 | 8/2005 | Weiblen et al. |
| 2006/0087430 A1 | 4/2006 | Zambon |
| 2008/0216883 A1 | 9/2008 | Leneke |
| 2009/0098657 A1 | 4/2009 | Blais et al. |
| 2010/0102235 A1 | 4/2010 | Haveri et al. |
| 2011/0147573 A1 | 6/2011 | Liess et al. |
| 2011/0174978 A1 | 7/2011 | Forg et al. |
| 2012/0006989 A1 | 1/2012 | Maston |
| 2012/0085907 A1 | 4/2012 | Tsuji |
| 2012/0100625 A1 | 4/2012 | Blais et al. |

\* cited by examiner sensor assembly in FIG.
OPTICAL SENSING ELEMENT ARRANGEMENT WITH INTEGRAL PACKAGE

BACKGROUND

The present disclosure relates to an optical sensing element and, more particularly, an optical sensing element having an integral package.

Optical sensors, such as those utilizing thermopile sensor arrays, are used in a variety of applications including, for example, energy-conserving home appliances, intelligent air conditioners, and ear and forehead thermometers.

SUMMARY OF THE INVENTION

In one aspect, a sensor assembly includes a hollow casing having a radiation entrance opening. A radiation-transmissive optic is at the radiation entrance opening. A substrate is inside and sealed against the hollow casing. An optical sensing element is coupled to the substrate and configured to sense radiation that has passed through the radiation-transmissive optic.

In another aspect, a method includes providing a hollow casing having a radiation entrance opening, coupling a radiation-transmissive optic to the hollow casing at the radiation entrance opening, positioning a substrate having an optical sensing element thereupon inside the hollow casing; and sealing the substrate against one or more surfaces of the hollow casing with the substrate positioned inside the hollow casing. The optical sensing element is configured to sense radiation that has passed through the radiation-transmissive optic.

In some implementations, one or more of the following advantages may be present.

For example, a compact sensor assembly may be provided that includes an optical sensing element and various supporting circuitry, such as a microcontroller, capacitors, application specific integrated circuits (ASICs) and an external electrical connector. The compact sensor assembly may include a sealed inner compartment that is either filled with inert gas or otherwise evacuated (i.e., under vacuum) to facilitate light transmission from the radiation-transmissive optic, through the sealed inner compartment and to the optical sensing element. Additionally, a convenient electrical connector may be provided to electrically couple the optical sensing element to an external component or connector.

Other features and advantages will be apparent from the description and drawings, and from the claims.

BRIEF DESCRIPTION OF THE DRAWINGS

Like reference characters refer to like elements.

DETAILED DESCRIPTION

Figure 1:
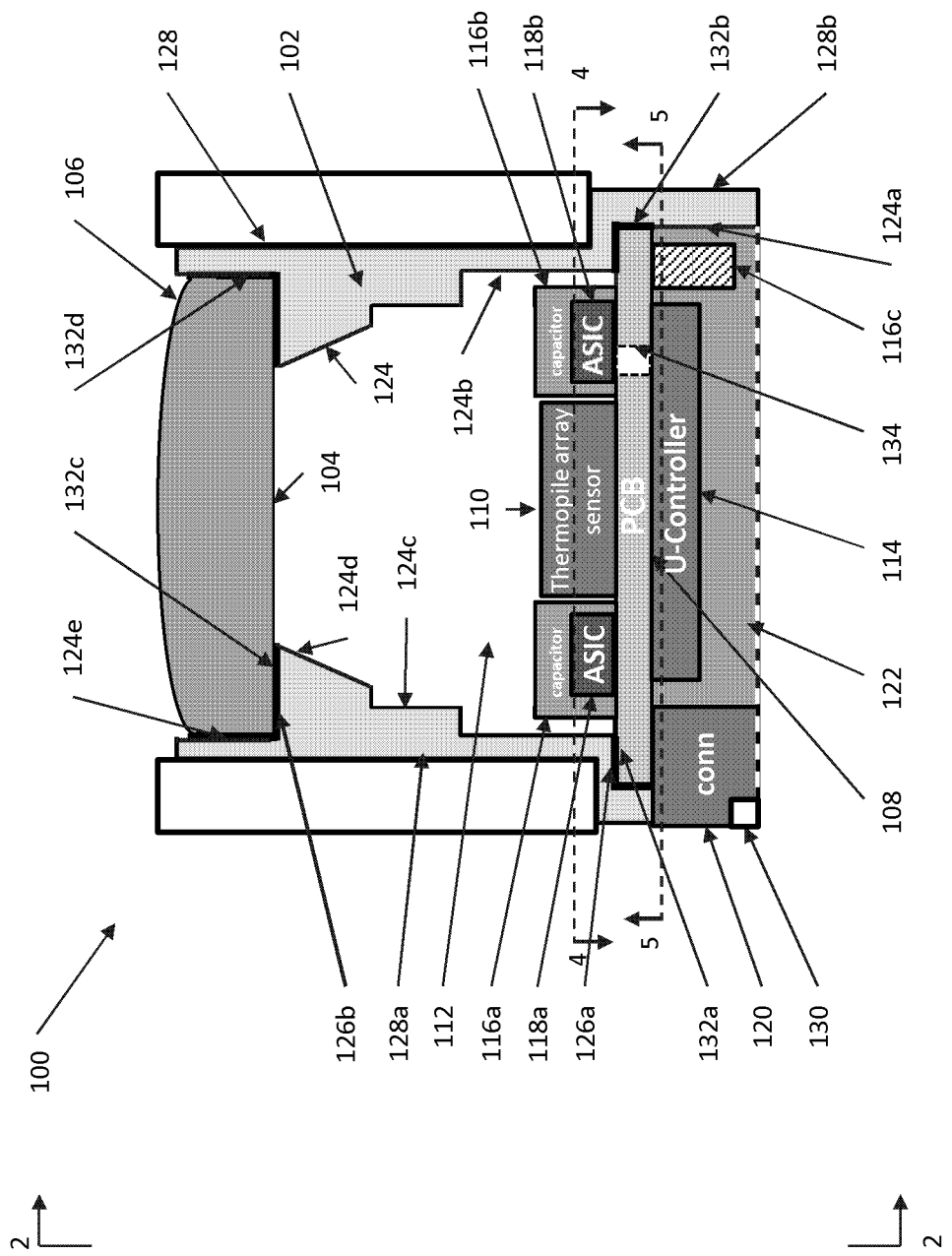
FIG. 1 is a schematic, side, cross-sectional view showing one implementation of a sensor assembly.

FIG. 1 is a side, cross-sectional view showing one implementation of a sensor assembly 100.

The sensor assembly 100 has a hollow casing 102 that defines a radiation entrance opening 104 at its upper end. A radiation-transmissive optic 106 is provided at the radiation entrance opening 104. A substrate 108 is inside and sealed against inner surfaces of the hollow casing 102. An optical sensing element 110 and other components are coupled to the substrate 108. The optical sensing element 110 is physically configured to sense radiation that passes through the radiation-transmissive optic 106.

In the illustrated implementation, the hollow casing 102, the radiation-transmissive optic 106 and the substrate 108 are sealed to each other as shown and, thereby, cooperatively define a sealed inner compartment 112. In general, the sealed inner compartment 112 provides a medium, through which radiation can pass from the radiation-transmissive optic 106 to the optical sensing element 110. In some implementations, the sealed inner compartment 112 is substantially gas-tight and either contains an inert gas, such as dry nitrogen, dry argon, xenon, or has an internal pressure much lower than atmospheric (e.g., a partial vacuum).

The other components, aside from the optical sensing element 110, that are physically coupled to the substrate 108 include a microcontroller 114, capacitors 116*a*-116*c*, and signal processing circuitry, including application specific integrated circuits (ASICs) 118*a*, 118*b*.

The specific placement of components on one side of the substrate 108 or the other can vary considerably. In the illustrated implementation, the capacitors 116*a*, 116*b* and the ASICs 118*a*, 118*b* are coupled to the same side of the substrate 108 as the optical sensing element 110 (i.e., the side of the substrate 108 facing the inner compartment 112). In addition, capacitor 116*c* and the microcontroller 114 are coupled to a side of the substrate 108 opposite the optical sensing element 110 (i.e., the side of the substrate 108 facing away from the inner compartment 112).

A potting compound 122 is provided over the side of the substrate 108 facing away from the inner compartment 112 and covers the microcontroller 114 and capacitor 116*c*.

The sensor assembly 100 has an electrical connector 120 that is electrically coupled to electrical circuitry on and the components coupled to the substrate 108. The electrical connector 120 extends through the potting compound and is exposed for connection to a component or connector (not shown) outside of the sensor assembly 100.

The hollow casing 102 has an inner surface 124 and an outer surface 128 that can be configured in a variety of ways. In general, the inner 124 and outer 128 surfaces of the hollow casing 102 are configured to support the radiation-transmissive optic 106, to contain the substrate 108 with various circuit components thereupon.

In the illustrated implementation, the outer surface 128 of the hollow casing 102 defines an upper, substantially cylindrical portion 128a with a first diameter and a lower, substantially cylindrical portion 128b with a second diameter, which, in the illustrated implementation, is larger than the first diameter. A cutout 130 is formed in the hollow casing 102 at the lower portion 128b, where the connector extends through the potting compound 122 and is exposed for connection to an external component or connector (not shown).

From bottom to top in the illustrated implementation, the inner surface 124 of the hollow casing 102 has a first portion 124a that, aside from the cutout 130, is substantially cylindrical; a second portion 124b that is also substantially cylindrical, but with a smaller diameter than the first portion 124a; a third portion 124c that is also substantially cylindrical, but with a smaller diameter than the second portion 124b, a frustoconical portion 124d, and an upper cylindrical portion 124e.

The change in diameter between the first portion 124a of the inner surface 124 and the second portion 124b of the inner surface 124 forms a first flange 126a near the bottom of the sensor assembly 100. The first flange 126a is flat, substantially annular and faces downward. In the illustrated implementation, the substrate 108, which is substantially cylindrical, has an outer annular portion on its upper surface that abuts the first flange 126a. Additionally, the substrate 108 is sized so that its outer edge is very close to the first portion 124a of the inner surface 124 when the substrate 108 is abutting the first flange 126a, as shown.

The substrate 108, in the illustrated implementation, is sealed against the hollow casing 102 at two interfaces. First, the substrate 108 is sealed with sealant 132a provided at the interface of the first flange 126a and the substrate 108. Second, the substrate 108 is sealed with sealant 132b provided at the interface between the outer edge of the substrate 108 and the inner surface 124 of the hollow casing 102 proximate the first flange 126a.

The sealant 132a, 132b can be any type of sealant. It is generally capable of producing a substantially gas-tight seal between the substrate 108 and the hollow casing 102. In addition to sealing, the sealant 132a, 132b also may help to adhere the substrate 108 to the hollow casing 102.

In a typical implementation, sealing the substrate 108 to the hollow casing 102 at two interfaces that are perpendicular to each other facilitates excellent sealing of the inner compartment 112. Moreover, as discussed below, the overall seal that is provided in this manner can very effectively withstand mechanical stresses that are particular to the illustrated arrangement.

For example, when the sensor assembly 100 is operating, the substrate 108 and the hollow casing 102 may experience different degrees of thermal expansion. When that happens, the sealant 132a between the substrate 108 and the first flange 126a experiences a sheer stress, whereas the sealant 132b between the substrate 108 and the inner surface 124 of the hollow casing 102 proximate the first flange 126a experiences a tensile stress. In a typical implementation, the sealant 132a between the substrate 108 and the first flange 126a helps to offset the tensile stress in the sealant 132b and the sealant 132b between the substrate 108 and the inner surface 124 of the hollow casing 102 proximate the first flange 126a helps to offset the sheer stress in the sealant 132a. Thus, the overall strength and resilience of the bond between the substrate 108 and the hollow casing 102 is high.

The change in diameter between the upper edge of the frustoconical portion 124d of the inner surface 124 and the upper cylindrical portion 124e of the inner surface forms a second flange 126b. The second flange 126b is flat, substantially annular and faces upward. In the illustrated implementation, the radiation-transmissive optic 106, which is substantially cylindrical, has an outer annular portion on its lower surface that abuts the second flange 126b. Additionally, the radiation-transmissive optics 106 is sized so that its outer edge is very close to the upper cylindrical portion 124e of the inner surface 124 when the radiation-transmissive optic 106 is abutting the second flange 126b, as shown.

The radiation-transmissive optics 106, in the illustrated implementation, is sealed against the hollow casing 102 at two interfaces. First, the radiation-transmissive optic 106 is sealed with sealant 132c provided at the interface of the second flange 126b and the radiation-transmissive optic 106. Second, the radiation-transmissive optic 106 is sealed with sealant 132d provided at the interface between the outer edge of the radiation-transmissive optic 106 and the inner surface 124 of the hollow casing 102 proximate the second flange 126b.

The sealant 132c, 132d can be any type of sealant. It is generally capable of producing a substantially gas-tight seal between the radiation-transmissive optic 106 and the hollow casing 102. In addition to sealing, the sealant 132a, 132b also may help to adhere the substrate 108 to the hollow casing 102.

In a typical implementation, sealing the radiation-transmissive optic 106 to the hollow casing 102 at two interfaces that are perpendicular to each other facilitates excellent sealing of the inner compartment 112. Moreover, as discussed below, the overall seal that is provided in this manner can very effectively withstand mechanical stresses that are particular to the illustrated arrangement.

For example, when the sensor assembly 100 is operating, the radiation-transmissive optic 106 and the hollow casing 102 may experience different degrees of thermal expansion. When that happens, the sealant 132c between the radiation-transmissive optic 106 and the second flange 126b experiences a sheer stress, whereas the sealant 132d between the radiation-transmissive optic 106 and the inner surface 124 of the hollow casing 102 proximate the second flange 126b experiences a tensile stress. In a typical implementation, the sealant 132c between the radiation-transmissive optic 106 and the second flange 126b helps to offset the tensile stress in the sealant 132d and the sealant 132d between the radiation-transmissive optic 106 and the inner surface 124 of the hollow casing 102 proximate the second flange 126a helps to offset the sheer stress in the sealant 132c. Thus, the overall strength and resilience of the bond between the radiation-transmissive optic 106 and the hollow casing 102 is high.

The substrate 108 can be virtually any type of substrate capable of supporting the optical sensing element 110 and other components. In the illustrated implementation, the substrate 108 is a printed circuit board.

The substrate 108, in the illustrated implementation, has surfaces that define an opening 134, through which the inert gas can flow into the inner compartment 112. In a typical implementation, during manufacturing, the inner compartment 112 can be purged by positioning the hollow casing 102, the radiation transmissive optic 106 and the substrate 108 in an environment that contains the inert gas so that the inert gas can flow through the opening 134 and into the inner compartment 112. Then the opening 134 is sealed with a plug while the hollow casing, the radiation transmissive optic and the substrate are still inside the inert gas environment.

The optical sensing element 110 can be virtually any type of optical sensing element. For example, in the illustrated implementation, the optical sensing element 110 is a thermopile sensor array.

In a typical implementation, the hollow casing 102 is a single structure that extends from the top of the hollow casing around the edges of the lens down to the bottom of the portion of the hollow casing that contains the potting compound 122. In those implementations, it is not formed from separate structures that are not rigidly attached to one another.

When the hollow casing 102 is a single structure, the portion of the hollow casing 102 that is adhered to the upper surface of the substrate (at 132a) thermally expands (or contracts) together with and in the same manner that the portion of the hollow casing 102 that is adhered to the edge of the substrate (at 132b). Moreover, when the hollow casing 102 is a single structure, the portion of the hollow casing 102 that is adhered to the lower surface of the optic (at 132c) thermally expands (or contracts) together with and in the same manner that the portion of the hollow casing 102 that is adhered to the edge of the optic (at 132d).

In some implementations, the hollow casing 102 may be formed as a single structure by casting the hollow casing 102 as a single structure, by welding different pieces together or the like.

Figure 2:
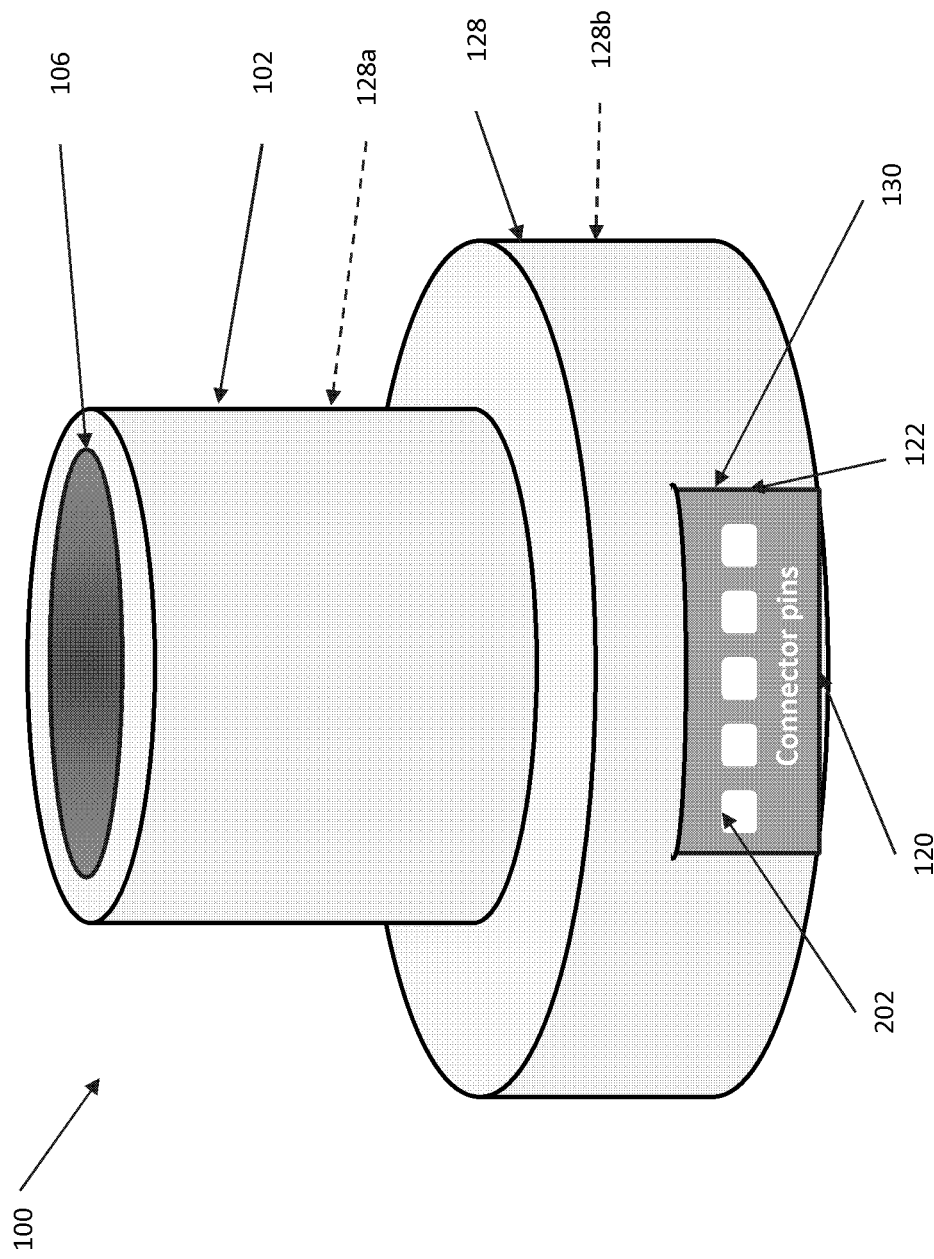
FIG. 2 is a schematic, side, perspective view of the sensor assembly in FIG. 1.

FIG. 2 is a side, perspective view of the sensor assembly in FIG. 1.

In this view it can be seen that the outer surface 128 of the hollow casing 102 defines an upper, substantially cylindrical portion 128a with a first diameter and a lower, substantially cylindrical portion 128b with a second diameter, which, in the illustrated implementation, is larger than the first diameter.

A cutout 130 is formed in the lower portion of the hollow casing 102, where the electrical connector 120 extends through the potting compound 122 and is exposed for connection to an external component or connector (not shown). In the illustrated implementation, the cutout 130 in the side portion of the hollow casing 102 spans in a circumferential direction only around part of the hollow casing 102.

The electrical connector 120 can be virtually any type of electrical connector. However, in the illustrated implementation, the electrical connector 120 is one that includes a row of electrically conductive pins 202.

The radiation-transmissive optic 106 is exposed at an upper surface of the sensor assembly 100.

Figure 3:
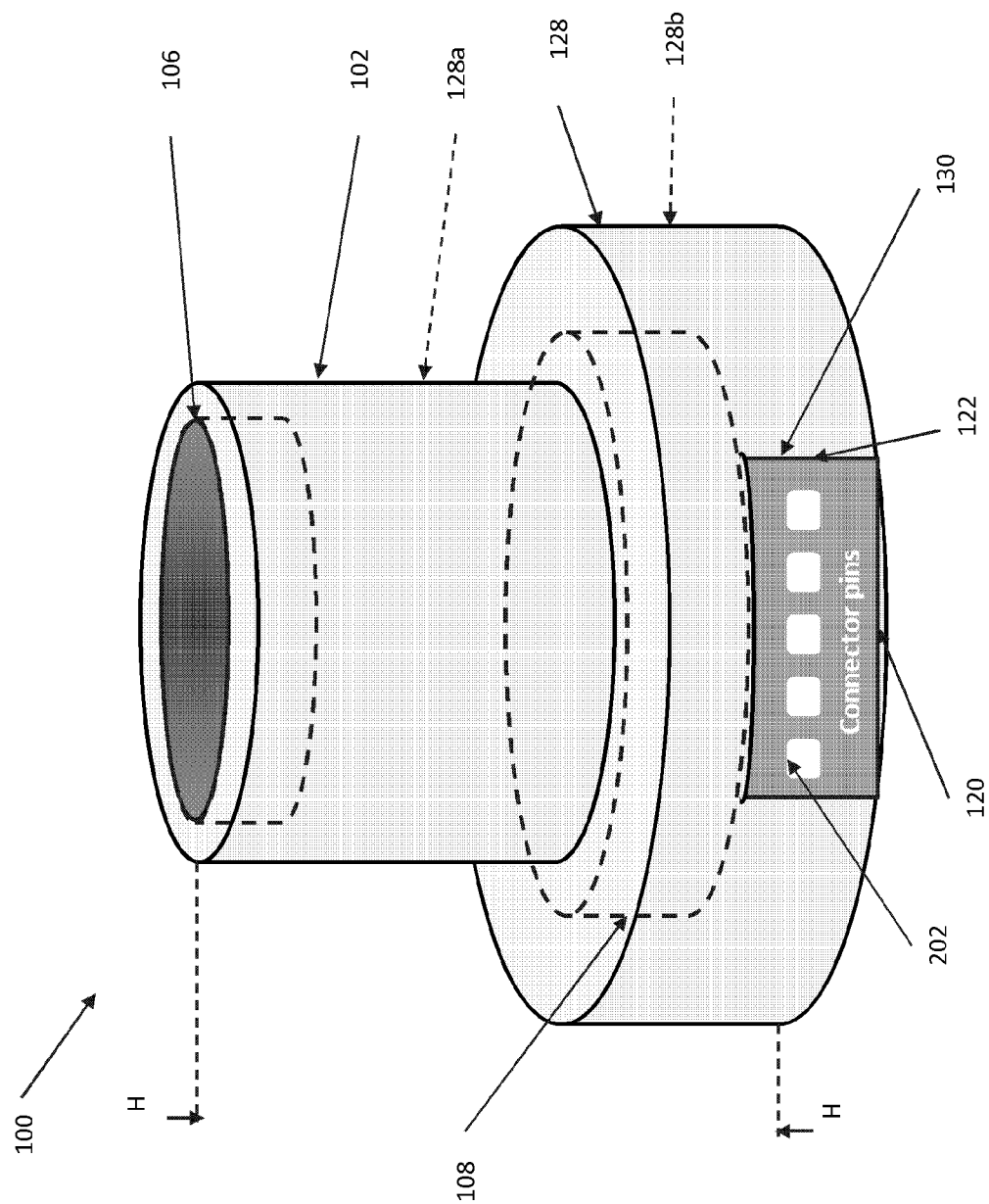
FIG. 3 is a schematic view that is similar to the view in FIG. 2 except that FIG. 3 also includes dashed lines that represent the respective locations and configurations of a radiation-transmissive optic and the substrate relative to the sensor assembly's hollow casing.

FIG. 3 is a view that is similar to the view in FIG. 2 except that FIG. 3 also includes dashed lines that represent the respective locations and configurations of the radiation-transmissive optic 106 and the substrate 108 inside the hollow casing 102 of the sensor assembly 100.

The physical configuration and dimensions of the sensor assembly 100 and its various components can vary considerably. In some implementations, for example, the overall height H of the sensor assembly 100 (i.e., the distance from the bottom of the sensor assembly near the potting compound to the top of the sensor assembly 100 near the radiation-transmissive lens 106) is between 2 and 25 millimeters.

Figure 4:
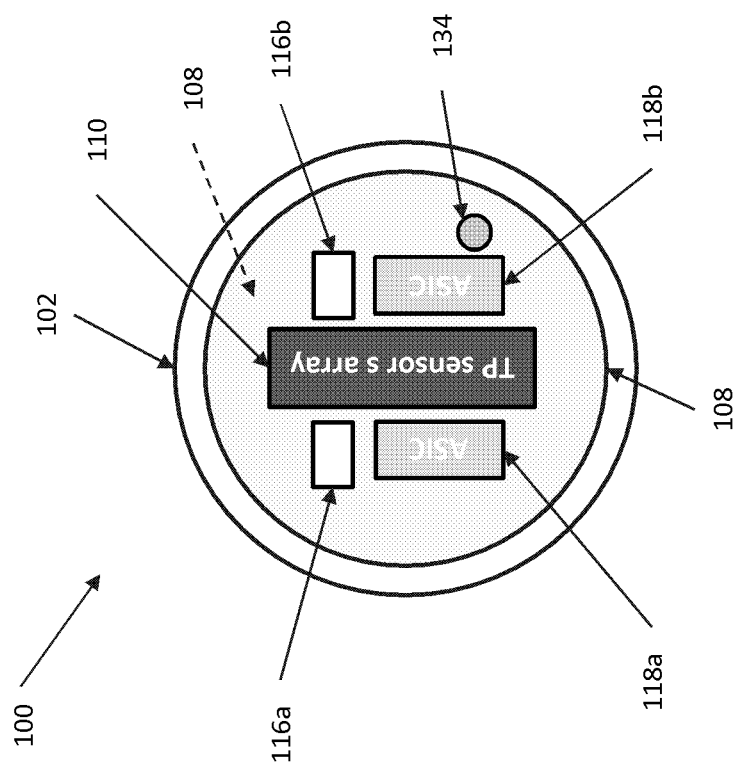
FIG. 4 is a schematic, cross-sectional approximation of the sensor assembly in FIG. 1 looking down from the line marked 4-4 in FIG. 1.

FIG. 4 is a schematic, cross-sectional approximation of the sensor assembly 100 looking down from the line marked 4-4 in FIG. 1.

According to the illustrated view, the optical sensor 100 is coupled to the upper surface of the substrate 108 and is approximately centered on the upper surface. Two ASICs 118a, 118b are coupled to the upper surface of the substrate 108, with one on each side of the optical sensor 110. Similarly, two capacitors 116a, 116b are coupled to the upper surface of the substrate 108, with one on each side of the optical sensor 110. The opening 134, through which inert gas can be introduced to fill the inner compartment 112, is next to the ASIC 118b.

Figure 5:
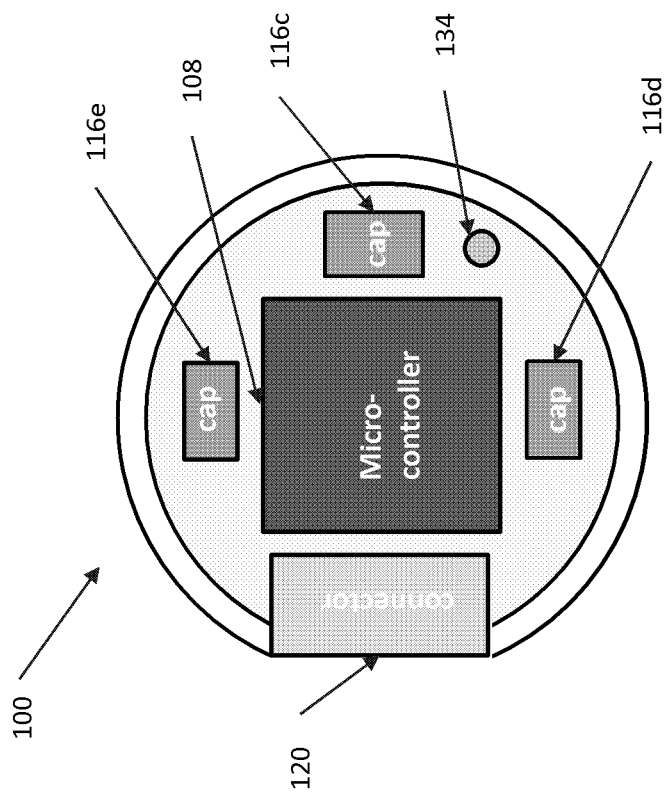
FIG. 5 is a schematic, cross-sectional approximation of the sensor assembly in FIG. 1 looking up from the line marked 5-5 in FIG. 1.

FIG. 5 is a schematic, cross-sectional approximation of the sensor assembly 100 looking up from the line marked 5-5 in FIG. 1.

According to the illustrated view, the microcontroller 114 is coupled to the lower surface of the substrate 108 and is approximately centered on the lower surface. Three capacitors 116c, 116d, 116e are coupled to the lower surface of the substrate 108, with one on each of three sides of the microcontroller 114. The electrical connector 120 is coupled to the lower surface of the substrate 108 and is proximate a fourth side of the microcontroller 108. The opening 134, through which inert gas can be introduced to fill the inner compartment 112, is between the capacitors 116c and 116d.

Figure 6:
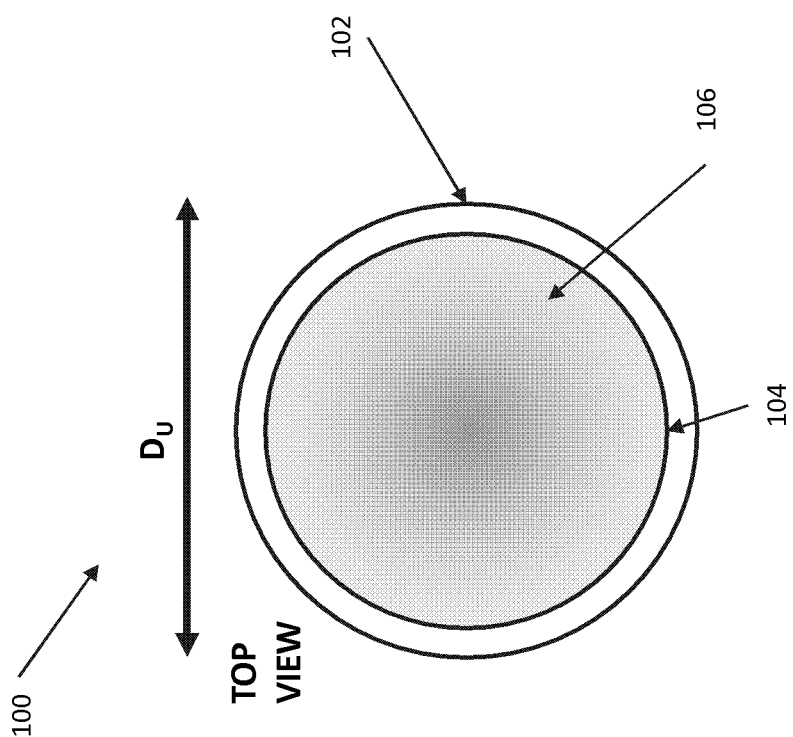
FIG. 6 is a partial top view of the sensor assembly in FIG. 1.

FIG. 6 shows a partial top view of the sensor assembly 100 in FIG. 1.

The view is partial because it does not show the lower portion of the hollow casing 102 that has a larger diameter than the upper portion of the hollow casing 102, which is shown.

According to the illustrated view, the upper portion of the housing 102 is substantially cylindrical and forms a radiation entrance opening 104 at its upper end that is substantially cylindrical as well. The radiation entrance opening 104 is covered by the radiation-transmissive optic 106.

In a typical implementation, the outer diameter $D_U$ across the upper portion of the sensor assembly's hollow casing 102 is between 4 and 10 millimeters.

Figure 7:
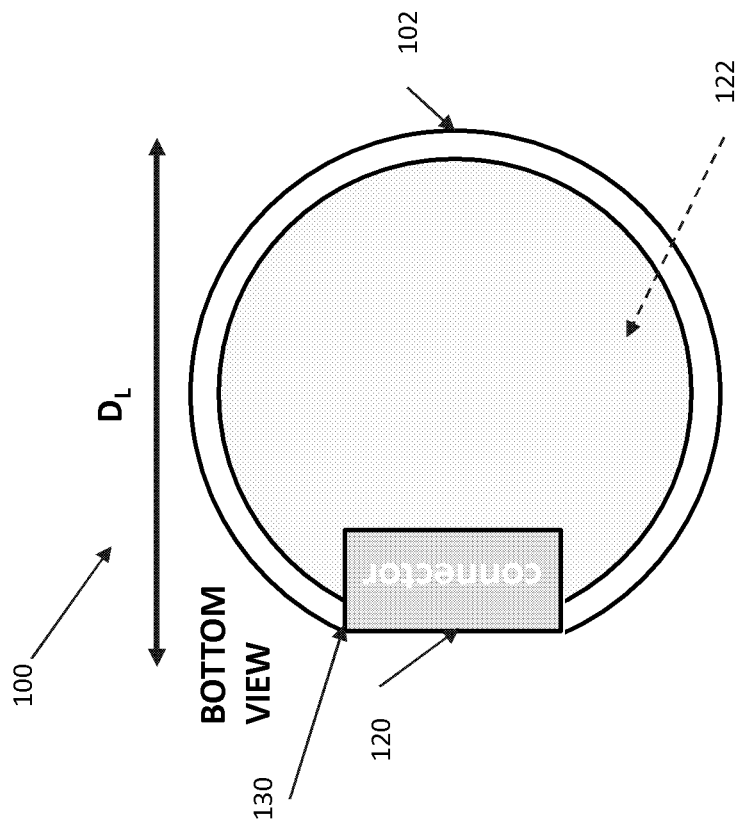
FIG. 7 is a bottom view of the sensor assembly in FIG. 1.

FIG. 7 is a bottom view of the sensor assembly 100 in FIG. 1.

According to the illustrated view, the bottom portion of the hollow casing 102 is substantially cylindrical, except for where the cutout 130 for the electrical connector 120 is located. The electrical connector 120 is exposed through the bottom of the potting compound 122 and is exposed for connection through the cutout 130.

In a typical implementation, the outer diameter $D_L$ across the lower portion of the sensor assembly's hollow casing is between 6 and 25 millimeters.

Figure 8:
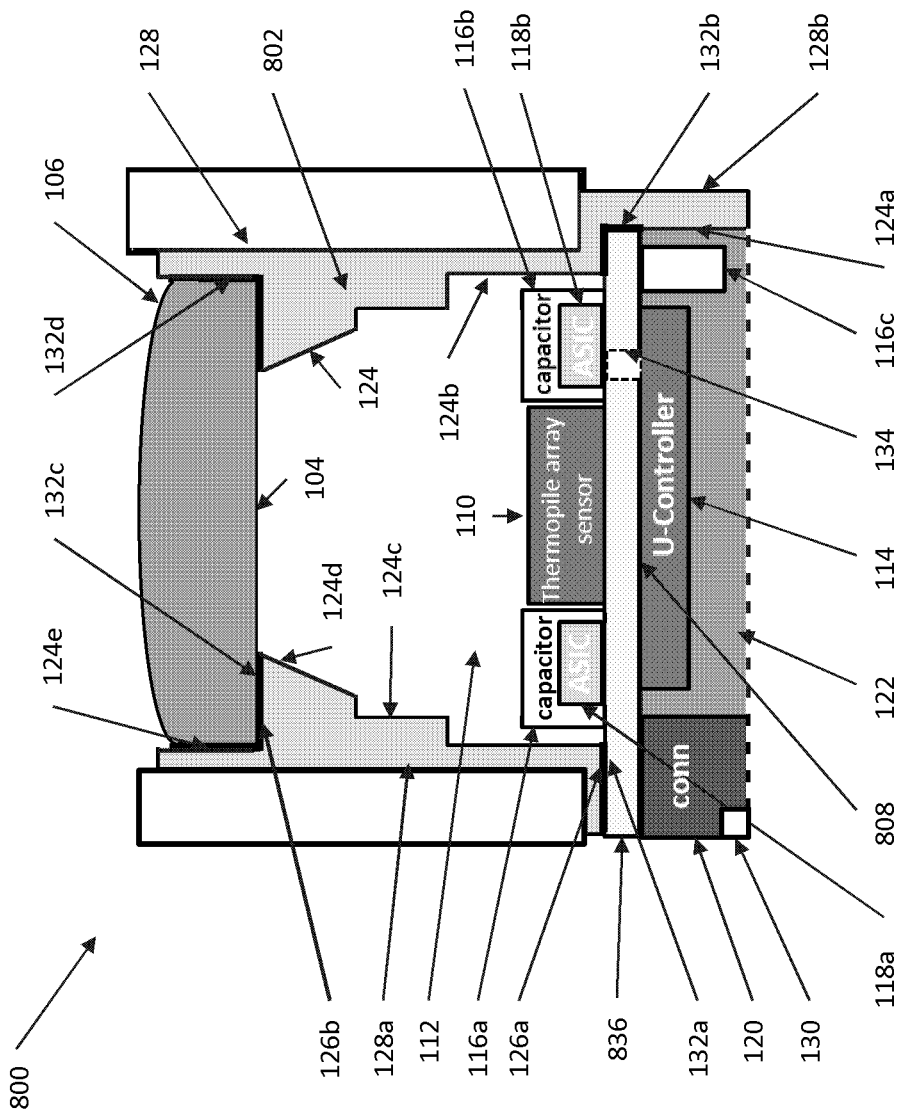
FIG. 8 is a schematic, side, cross-sectional view showing another implementation of a sensor assembly.

FIG. 8 is a side, cross-sectional view showing another implementation of a sensor assembly 800.

The sensor assembly 800 shown in FIG. 8 is similar to the sensor assembly 100 in FIG. 1 except that an edge portion 836 of the substrate 808 in sensor assembly 800 is exposed through the cutout 830 in the side of the hollow casing 802.

According to the illustrated implementation, both the edge portion 836 of the substrate 808 and the electrical connector 120 are exposed through the cutout 130 in the side portion of the hollow casing 802.

Figure 9:
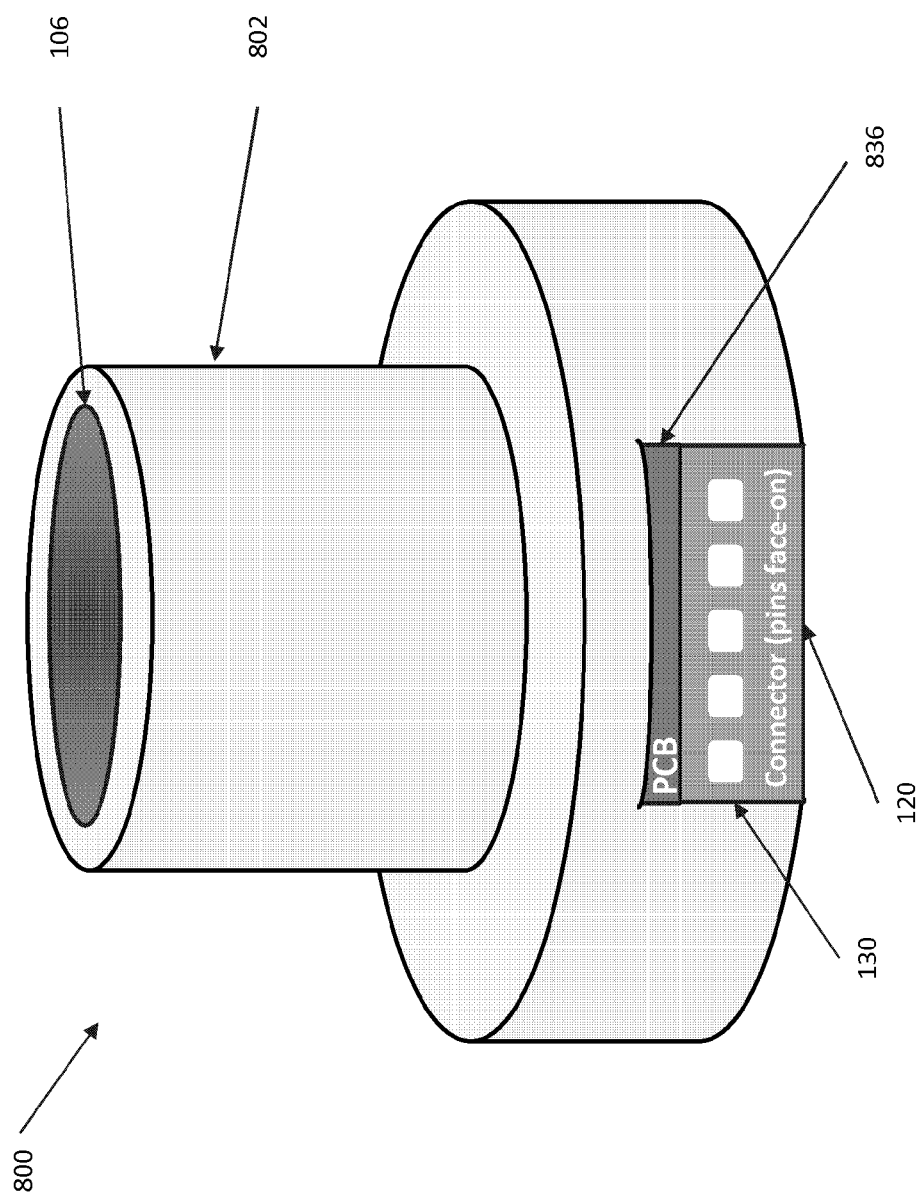
FIG. 9 is a side, perspective view of the sensor assembly in FIG. 8.

FIG. 9 is a side, perspective view of the sensor assembly 800 in FIG. 8.

In the illustrated implementation, the cutout 130 in the side portion of the hollow casing 802 spans in a circumferential direction only around part of the hollow casing 802.

FIG. 10A-10H represent a sequence of process steps in manufacturing a sensor assembly, such as sensor assembly 800 of FIG. 8, according to one implementation.

Figure 10A:
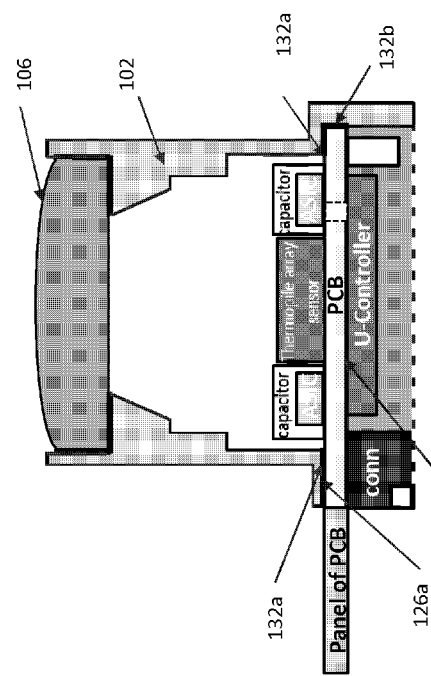
FIG. 10A-10H represent a sequence of process steps in manufacturing a sensor assembly, such as sensor assembly in FIG. 8, according to one implementation.

Referring to FIG. 10A, the manufacturing process includes attaching the radiation-transmissive optic 106 to the hollow casing 102.

In some implementations, this step includes: covering the second flange 126b with sealant 132c, pressing the radiation-transmissive optic 106 against the second flange 126b as shown, filling in the small gap between the outer edge of the radiation-transmissive optic 106 and the upper cylindrical portion 124e of the sensor assembly's inner surface 124 with additional sealant 132d and curing the sealant 132c, 132d.

Figure 10D:
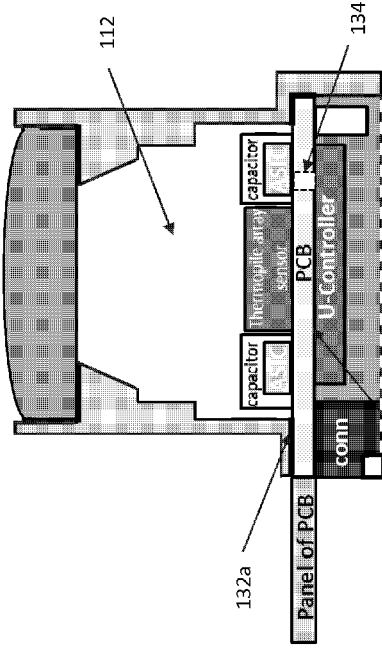
Figure 10B:
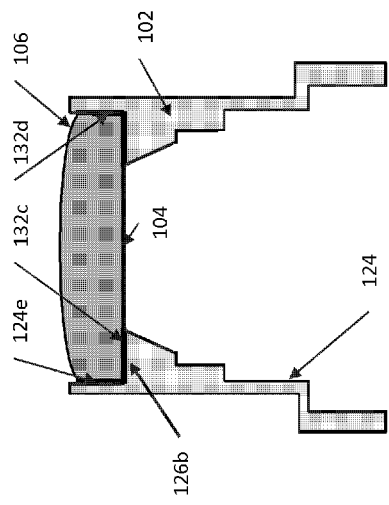

Referring now to FIG. 10B, the manufacturing process includes providing a substrate 808 with one or more circuit components coupled to the substrate 808.

In some implementations, the substrate 808 may be provided as one of many similar (or identical) substrates that are coupled to a supportive panel. Typically, each of the substrates would be individually separable the panel at a respective break-off line. An example of this kind of panel that includes multiple, similar (or identical) substrates is shown in FIG. 11.

Figure 11:
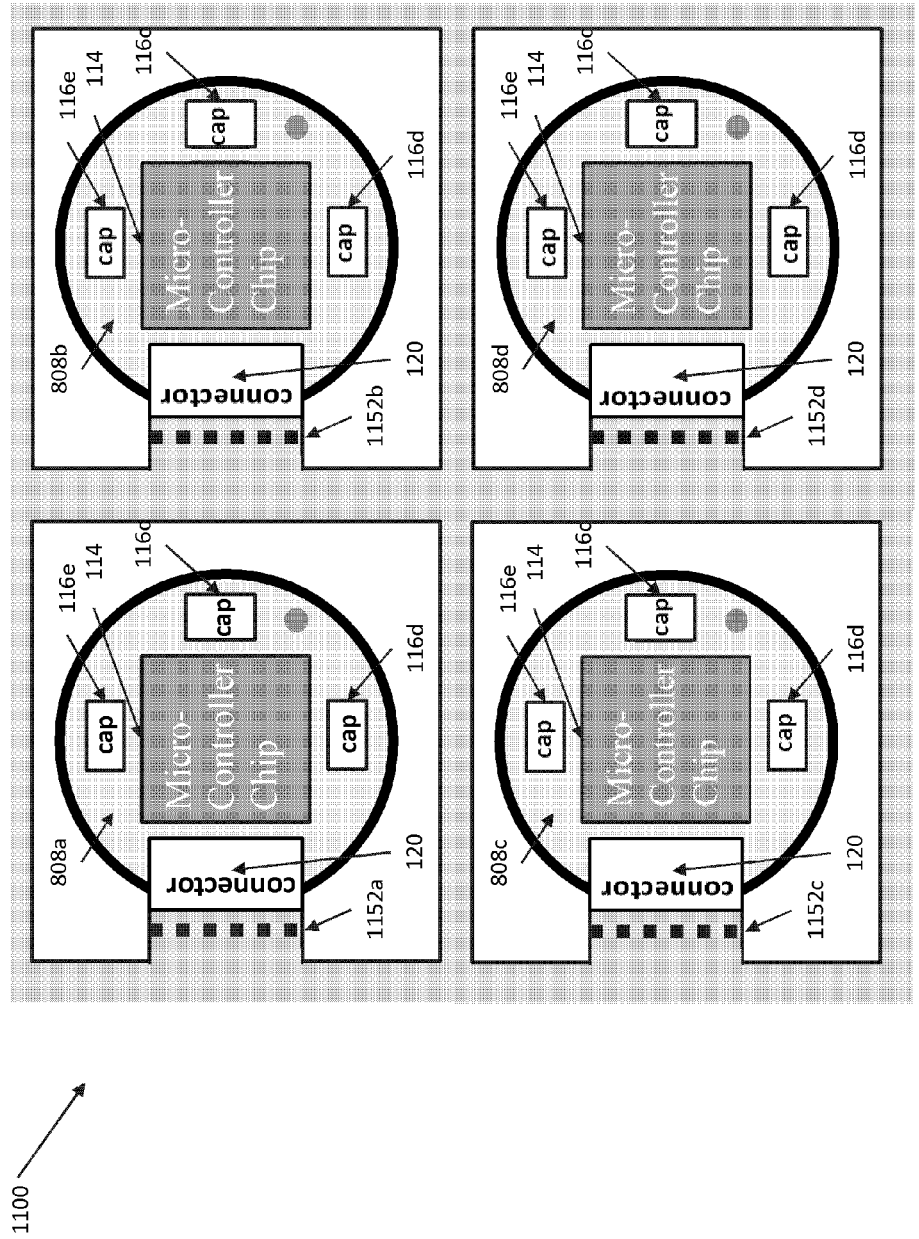
FIG. 11 is a schematic top view showing part of a panel with multiple identical substrates attached to the panel.

More particularly, FIG. 11 is a schematic top view showing part of a panel 1150 with multiple identical substrates 808a-808d attached to the panel 1150.

Each substrate 808a-808d is individually separable from the panel 1150 at a respective break-off line 1152a-1152d. The break-off lines 1152a-1152d are perforated, or otherwise structurally compromised, lines that extend across the tabs that connect each respective substrate 808a-808d to the panel 1150.

In the illustrated view, the bottom surface of each substrate 808a-808d is shown. Multiple circuit components are attached to the bottom surface of each substrate 808a-808d. More particularly, each substrate 808a-808d has a microcontroller 114, three capacitors 116c, 116d, 116e and an electrical connector 120 coupled to it. Also represented in the illustrated implementation, is an opening 134 in each substrate 808a-808d, through which inert gas can pass to fill the inner compartment 112 of a resulting sensor assembly when the substrate is coupled to a hollow casing.

In a typical implementation, the side of each substrate 808a-808d opposite from the side that is shown in FIG. 11 would include other circuit components. For example, in some implementations, these circuit components might include an optical sensor, one or more ASICs and one or more capacitors.

Referring again to FIG. 10B, the illustrated substrate 808 is attached to a panel that may include other similar (or identical) substrates.

The components that are coupled to the upper surface of the substrate 808 include the optical sensor 110, capacitors 116a, 116b and ASICs 118a, 118b. The components that are coupled to the lower surface of the substrate include a microcontroller 114, an electrical connector 120 and a capacitor 116c.

The components may be electrically coupled to conductive elements at the substrate 808 using a variety of techniques. For example, in some implementations, the optical sensor 110, capacitors 116a, 116b and microcontroller 114 may be electrically coupled with a solder connection, whereas the optical sensor 110 and ASICs 118a, 118b may be electrically coupled with a wire bond connection.

Figure 10C:
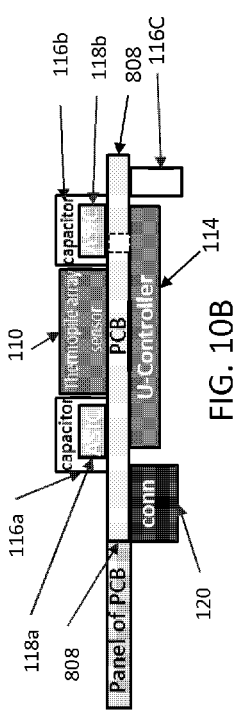

Referring now to FIG. 10C, the manufacturing process includes applying sealant 132a so that it will provide a seal between the substrate 808 and the hollow casing 102 when they are brought together. This can include applying sealant to the substrate, to the hollow casing or to both. In the illustrated implementation, however, the sealant 132a is applied to an area allocated on the upper surface of the substrate 808. The sealant 132a typically is applied in such a manner that it will form a continuous seal around a perimeter of the sensor assembly between the substrate and the hollow casing 102. In some implementations, the sealant 132a is applied to form a substantially annular path around an outer perimeter of the upper surface of the substrate 808.

The sealant can be virtually any type of sealing epoxy or other substance that can form a seal.

Referring now to FIG. 10D, the manufacturing process includes placing the hollow casing 102 with the optical element 106 upon the substrate 808. More particularly, in the illustrated implementation, the hollow casing 102 is positioned such its first flange 126a is in contact with the sealant 132a on the upper surface of the substrate 808.

Once the hollow casing 102 is positioned as shown in FIG. 10D, an additional amount of sealant 132b is provided around the edge of the substrate 808 between the substrate 808 and an inner surface of the hollow casing 102 next to the first flange 126a.

The sealant 132a, 132b between the substrate 808 and the hollow casing 102 is then cured.

Figure 10E:
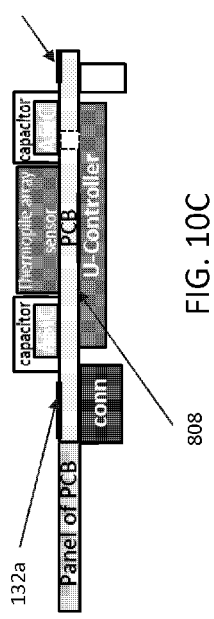

Referring now to FIG. 10E, the manufacturing process can included displacing or removing the air inside the inner compartment 112 to provide a medium that facilitates the passage of radiation to the optical sensing element 110. This can be done, for example, by purging the inner compartment 112 with an inert gas or creating a partial vacuum (i.e., a pressure much lower than atmospheric) inside the inner compartment 112.

Purging, for example, may include exposing the assembly shown in FIG. 10E to an inert gas environment, allowing the inert gas to flow through the opening 134 in the substrate 808, thereby, filling the inner compartment and then plugging or otherwise sealing the opening 134. Similarly, creating a partial vacuum may include exposing the assembly shown in FIG. 10E to a low pressure environment, drawing air out of the inner compartment through the opening 134 in the substrate 808 and then plugging or otherwise sealing the opening 134 using a suitable adhesive 135. In some implementations, the adhesive is an ultraviolet-curable glue, but other adhesives are acceptable as well.

Figure 10H:
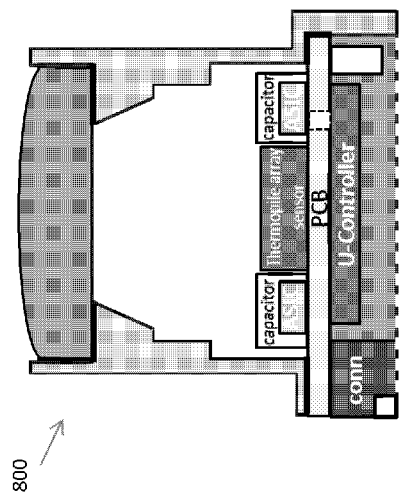
Figure 10F:
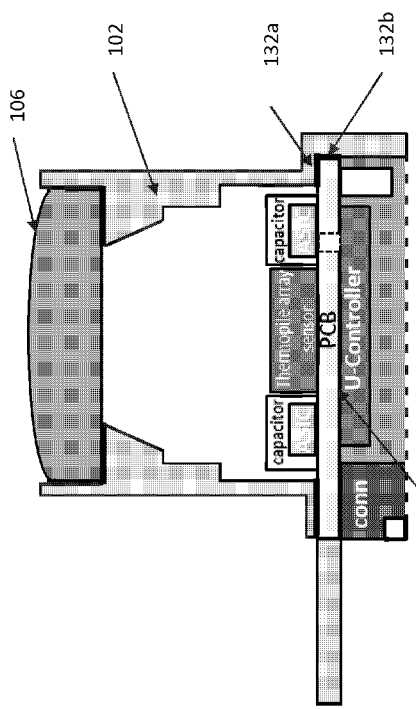

Referring now to FIG. 10F, the manufacturing process includes providing and curing additional sealant 132b, as needed to seal, around the substrate 808 between the outer edge of the substrate and the inner surface of the hollow casing 102 next to the first flange 132a.

Figure 10G:
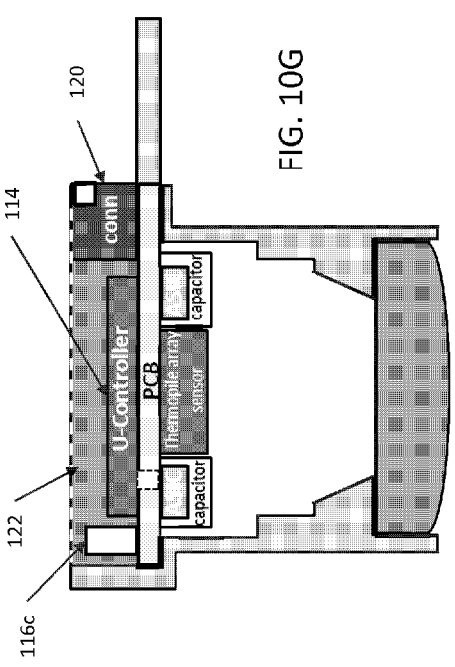

Referring now to FIG. 10G, the manufacturing process includes applying potting compound 122 to at least partially cover the circuit components and electrical connector on the surface of the substrate 808 that is externally exposed. In the illustrated implementation, for example, the potting compound is provided to completely cover the capacitor 116c and the microcontroller 114 and to partially cover the electrical connector 120, leaving only the portion of the electrical connector 120 that includes the connector pins exposed for external connection.

Virtually any type of potting compound (e.g., thermo-setting plastics or silicone rubber gels) can be used as the potting compound.

Referring now to FIG. 10H, the manufacturing process includes singulating the completed sensor assembly 800 (i.e., separating the completed sensor assembly 800 from the panel) and testing the completed sensor assembly 800.

Figure 12:
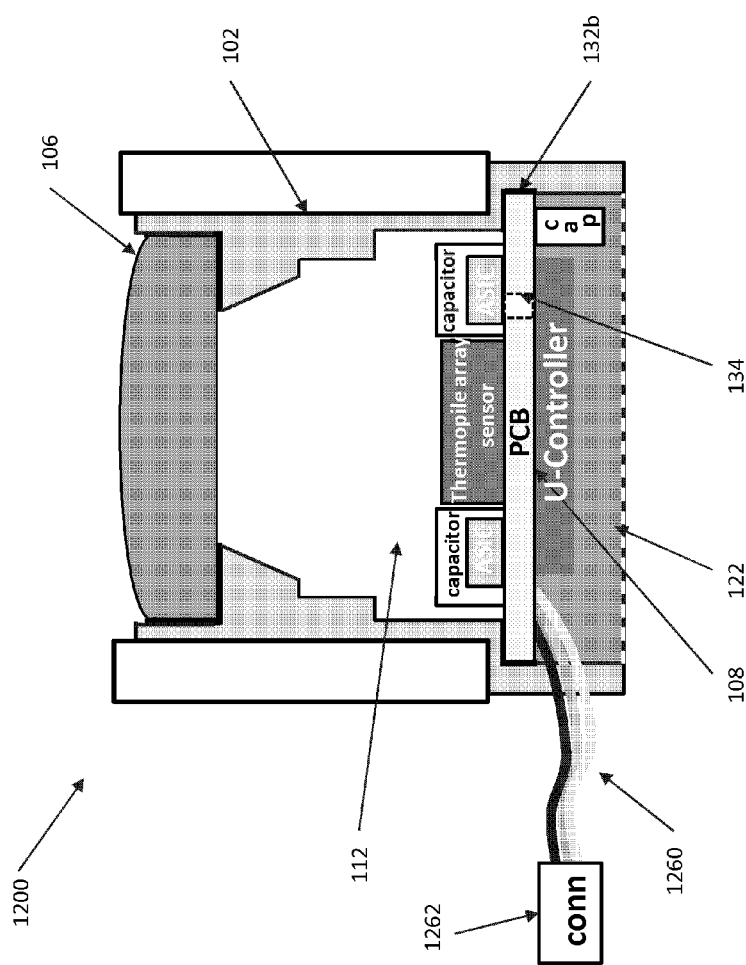
FIG. 12 is a schematic, side, cross-sectional view showing another implementation of a sensor assembly.

FIG. 12 shows a sensor assembly 1200 that is similar to the sensor assembly 100 in FIG. 1, except that the sensor assembly 1200 has wires 1260 that extend from circuitry on the substrate 108, with an electrical connector 1262 at a distal end of the wires 1260. In a typical implementation, the wires would extend through one or more cutouts in the side of the hollow casing 102.

Figure 13:
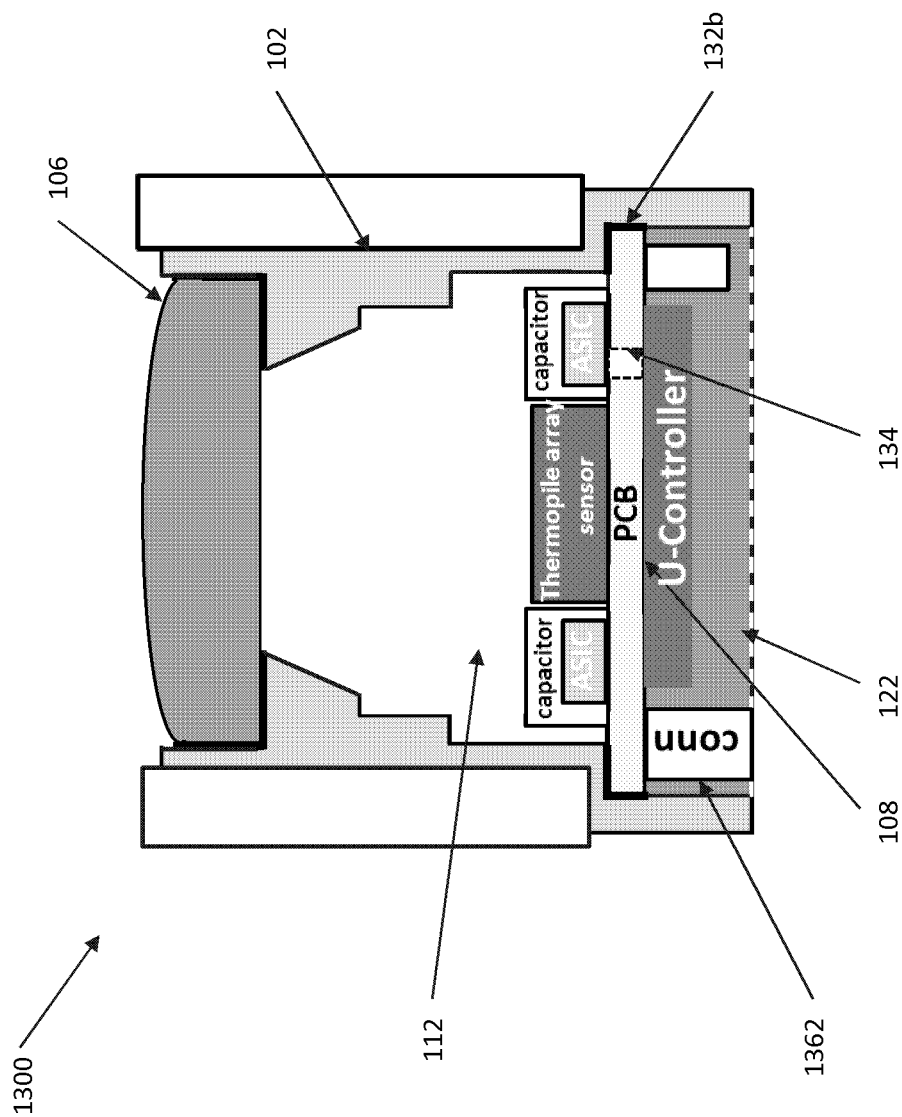
FIG. 13 is a schematic, side, cross-sectional view showing yet another implementation of a sensor assembly.

FIG. 13 shows a sensor assembly 1300 that is similar to the sensor assembly 100 in FIG. 1, except that the connector 1362 in the sensor assembly 1300 extends at a right angle from the bottom surface of the substrate 108 and protrudes through a bottom surface of the potting compound 122. There is also no cutout in a side surface of the hollow casing for the connector to be accessed.

Figure 14:
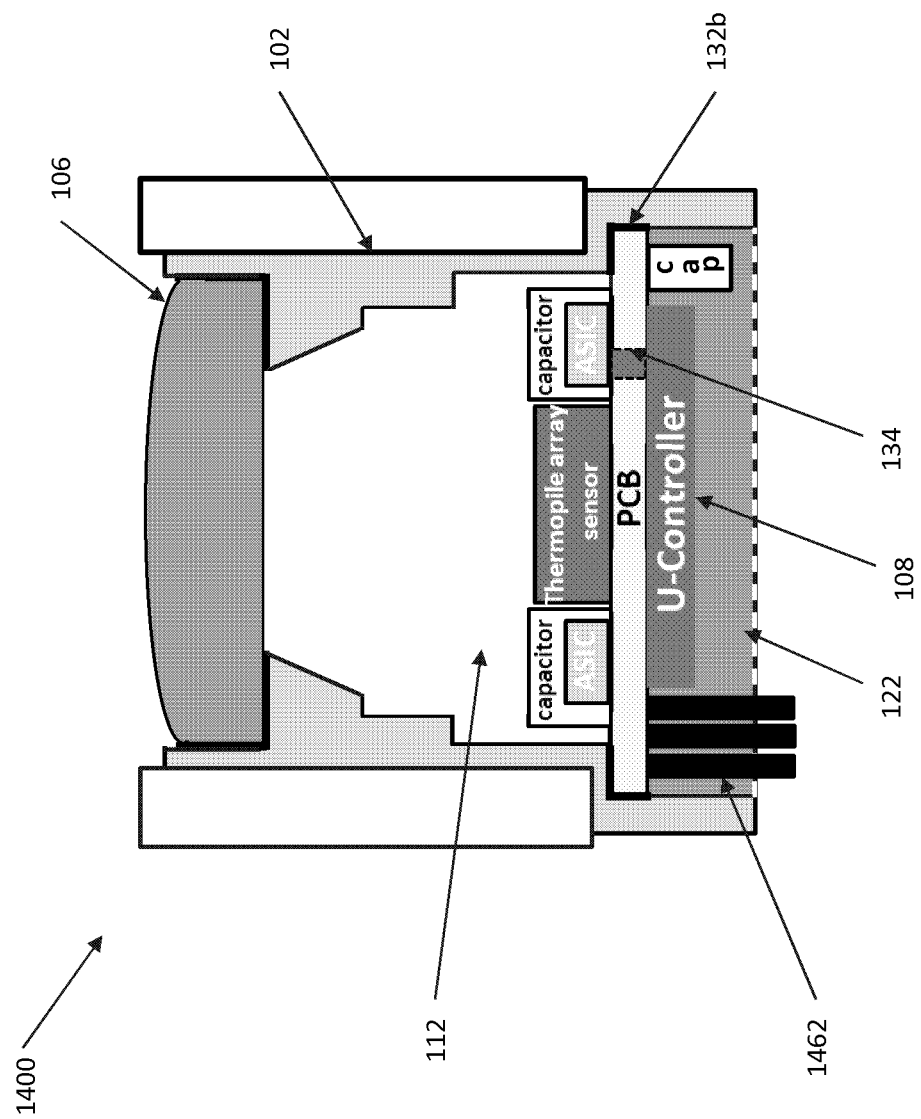
FIG. 14 is a schematic, side, cross-sectional view showing still another implementation of a sensor assembly.

FIG. 14 shows a sensor assembly 1400 that is similar to the sensor assembly 100 in FIG. 1, except that the connector 1462 in the sensor assembly 1400 includes a set of pins that extends at a right angle from the bottom surface of the substrate 108 and protrudes through a bottom surface of the potting compound 122. The pins facilitate mounting the sensor assembly 1400 to a printed circuit board using, for example, through-hole technology. There is also no cutout in a side surface of the hollow casing for the connector to be accessed.

Figure 15:
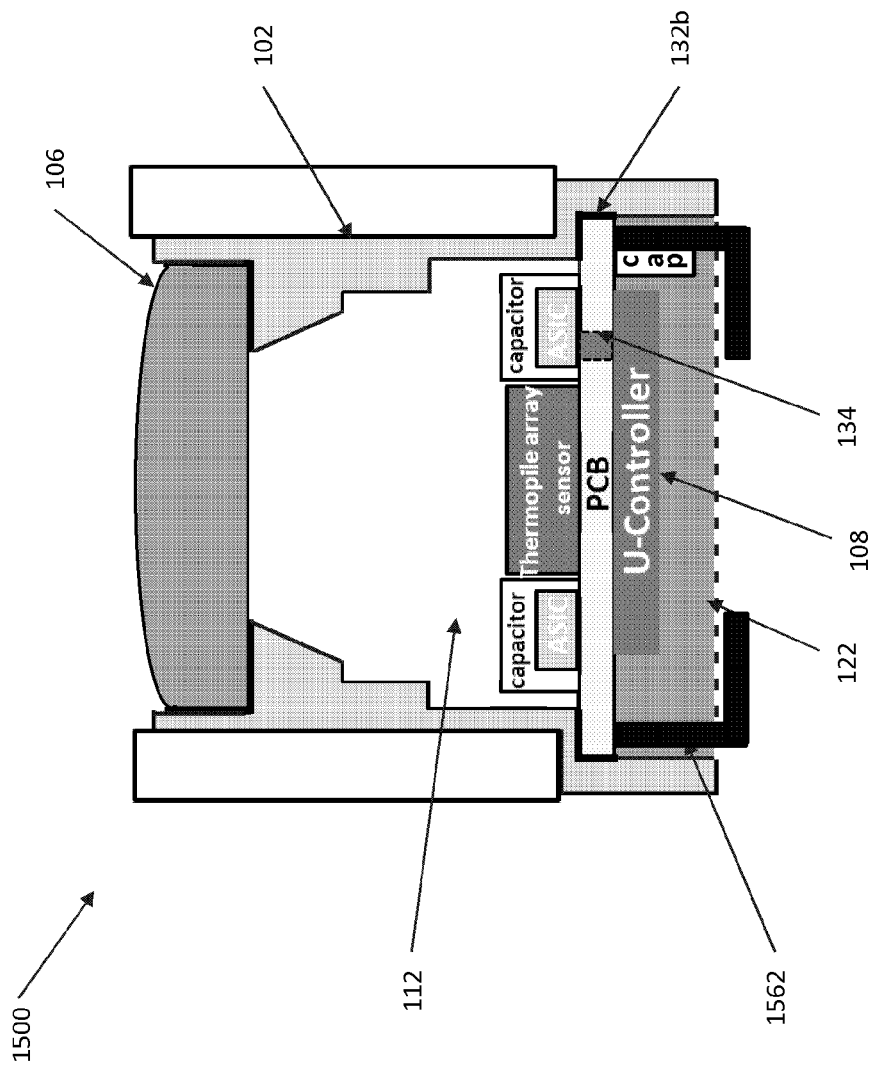
FIG. 15 is a schematic, side, cross-sectional view showing yet another implementation of a sensor assembly.

FIG. 15 shows a sensor assembly 1500 that is similar to the sensor assembly 100 in FIG. 1, except that the connector 1562 in the sensor assembly 1500 includes J-leads that extend at a right angle from the bottom surface of the substrate 108 and protrude through a bottom surface of the potting compound 122. The J-leads facilitate mounting the sensor assembly 1500 to a printed circuit board using, for example, surface mount technology (SMT). There is also no cutout in a side surface of the hollow casing for the connector to be accessed.

Figure 16:
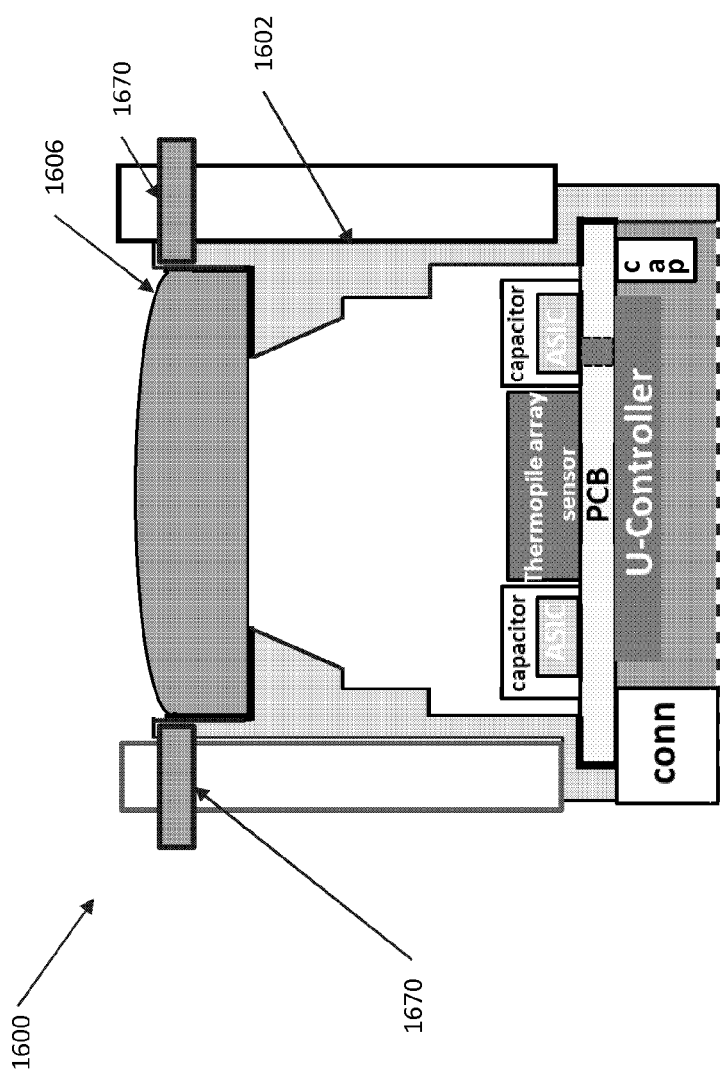
FIG. 16 is a schematic, side, cross-sectional view showing still another implementation of a sensor assembly.

FIG. 16 shows a sensor assembly 1600 that is similar to the sensor assembly 100 in FIG. 1, except that the hollow casing 1602 and the radiation-transmissive optic 1606 in the sensor assembly 1600 is configured to facilitate panel-mounting. More particular, the radiation-transmissive optic 1606 extends beyond the outer edge of the hollow casing an amount that would enable the radiation-transmissive optic 1606 to extend at least partially through a hole in a panel 1670, with the outer edge of the hollow casing flush against an inner surface of the panel 1670.

A number of embodiments of the invention have been described. Nevertheless, it will be understood that various modifications may be made without departing from the spirit and scope of the invention.

For example, the radiation-transmissive optic may be mounted to the hollow casing using a variety of techniques, including, for example, the mounting techniques disclosed in U.S. Patent Application Publication No. U.S. 2011/0147573, which is incorporated by reference in its entirety herein.

The precise configuration, physical dimensions and arrangement of the various components in the sensor assembly can vary considerably. In some implementations, the sensor assembly can include other components not shown or disclosed herein and, in some implementations, the sensor assembly may not include one or more of the components disclosed herein. In other configurations the housing shown as cylindrical in all the figures, could be made rectangular or square, elliptical or other shape in cross section (c.f. FIG. 7). The substrate 108 could be shaped to suit any particular shape of opening 128B in the housing 102. The outer shape of the housing 102 could be different from the opening 128B. It will be obvious to those proficient in the art that the body 102 can be of any suitable shape to suit the application.

The components, sealant and inert gas may be formed using a variety of different substances.

The optical sensing element can utilize virtually any type of optical sensing technology.

The sequence of events in the manufacturing processes disclosed herein may be varied and, in some implementations, one or more of steps in the sequence may be omitted.

The sensor assembly can be used in a variety of different applications.

The relative terms, such as "upper," "lower," "above," "below," "up," "down," "top" and "bottom" as well as derivative thereof (e.g., "downwardly," "upwardly," etc.) used herein should be construed to refer to the orientation as then described or as shown in the drawing under discussion. These relative terms are for convenience of description and do not require that the apparatus be constructed or operated in a particular orientation. Terms concerning attachments, coupling and the like, such as "attached," "connected," and "coupled," refer to a relationship wherein structures are secured or attached to one another either directly or indirectly through intervening structures, as well as both movable or rigid attachments or relationships, unless explicitly described otherwise.

Other implementations are within the scope of the claims.

What is claimed is:

1. A sensor assembly comprising:
a hollow casing having a radiation entrance opening;
a radiation-transmissive optic at the radiation entrance opening,
a substrate inside and sealed against an inner surface of the hollow casing; and
an optical sensing element coupled to the substrate and configured to sense radiation that has passed through the radiation-transmissive optic,
wherein the hollow casing is a single structure that extends from a top of the hollow casing around an edge of the radiation-transmissive optic down to a bottom of the portion of the hollow casing that contains a potting compound, and
wherein a portion of the hollow casing that is adhered to an upper surface of the substrate thermally expands and contracts with a portion of the hollow casing that is adhered to an edge of the substrate.

2. The sensor assembly of claim 1 wherein the hollow casing, the radiation-transmissive optic and the substrate cooperatively define an inner compartment.

3. The sensor assembly of claim 2 further comprising:
an inert gas contained within the inner compartment.

4. The sensor assembly of claim 1 further comprising:
a potting compound covering a side of the substrate opposite the optical sensing element.

5. The sensor assembly of claim 1 further comprising:
an electrical connector coupled to electrical circuitry on the substrate and extended through a potting compound.

6. The sensor assembly of claim 1 wherein the hollow casing has an inner surface with a first flange and the substrate abuts the first flange.

7. The sensor assembly of claim 6 further comprising sealant between the first flange and the substrate.

8. The sensor assembly of clam 7 further comprising sealant between an edge of the substrate and an inner surface of the hollow casing proximate the first flange.

9. The sensor assembly of claim 8 wherein a surface of the first flange that the substrate abuts is substantially perpendicular to the inner surface of the hollow casing proximate the first flange.

10. The sensor assembly of claim 1 wherein the hollow casing has an inner surface with a second flange at or near the radiation entrance window and the radiation-transmissive optic abuts the second flange.

11. The sensor assembly of claim 10 further comprising sealant between the radiation-transmissive optic and the second flange as well as between the radiation-transmissive optic and an inner surface of the hollow casing proximate the second flange.

12. The sensor assembly of claim 11 wherein a surface of the second flange that the radiation-transmissive optic abuts is substantially perpendicular to the inner surface of the hollow casing proximate the second flange.

13. The sensor assembly of claim 1 further comprising:
a microcontroller, one or more capacitors, and signal processing circuitry physically coupled to the substrate.

14. The sensor assembly of claim 13 wherein at least one of the microcontroller, the one or more capacitors, and the signal processing circuitry is physically coupled to an opposite side of the substrate from the optical sensing element.

15. The sensor assembly of claim 1 wherein the substrate is a printed circuit board.

16. The sensor assembly of claim 1 wherein the optical sensing element is a thermopile sensor array.

17. The sensor assembly of claim 1 wherein a portion of the hollow casing that is adhered to a lower surface of the radiation-transmissive optic thermally expands or contracts with a portion of the hollow casing that is adhered to an edge of the radiation-transmissive optic.

18. A method comprising:
providing a hollow casing having a radiation entrance opening;
coupling a radiation-transmissive optic to the hollow casing at the radiation entrance opening;
positioning a substrate having an optical sensing element thereupon inside the hollow casing; and
sealing the substrate against one or more inner surfaces of the hollow casing,
wherein, with the substrate positioned inside the hollow casing, the optical sensing element is configured to sense radiation that has passed through the radiation-transmissive optic, and the hollow casing, the radiation-transmissive optic and the substrate cooperatively define a sealed inner compartment, and wherein
proving the hollow casing comprises forming the hollow casing as a single structure that extends from a top of the hollow casing around an edge of the radiation-transmissive optic down to a bottom of the portion of the hollow casing that contains a potting compound, such that a portion of the hollow casing that is adhered to an upper surface of the substrate thermally expands and contracts with a portion of the hollow casing that is adhered to an edge of the substrate.

19. The method of claim 18, the method further comprising:
purging the inner compartment with an inert gas.

20. The method of claim 19 wherein the substrate has surfaces that define an opening, through which the inert gas can flow, and wherein purging the inner compartment comprises:
positioning the hollow casing, the radiation transmissive optic and the substrate in an environment that contains the inert gas so that the inert gas can flow through the opening and into the inner compartment; and
plugging the opening while the hollow casing, the radiation transmissive optic and the substrate are inside the inert gas environment to seal the inert gas within the inner compartment.

21. The method of claim 18 wherein the hollow casing has an inner surface with a first flange, and
wherein positioning the substrate inside the hollow casing comprises positioning the substrate to abut the first flange.

22. The method of claim 21 wherein sealing the substrate against one or more surfaces of the hollow casing comprises:
providing a sealant between the substrate and the first flange.

23. The method of claim 22 wherein sealing the substrate against one or more surfaces of the hollow casing further comprises:
providing the sealant between an edge of the substrate and an inner surface of the hollow casing proximate the first flange.

24. The method of claim 22 wherein a surface of the first flange that the substrate abuts is substantially perpendicular to the inner surface of the hollow casing proximate the first flange.

25. The method of claim 18 wherein the hollow casing has an inner surface with a second flange at or near the radiation entrance window, and
wherein coupling the radiation-transmissive optic to the hollow casing at the radiation entrance opening comprises positioning the radiation-transmissive optic to abut the second flange.

26. The method of claim 25 further comprising:
providing a sealant between the radiation-transmissive optic and the second flange as well as between the radiation-transmissive optic and an inner surface of the hollow casing proximate the second flange.

27. The method of claim 26 wherein a surface of the second flange that the radiation-transmissive optic abuts is substantially perpendicular to the inner surface of the hollow casing proximate the second flange.

28. The method of claim 18 further comprising:
covering a side of the substrate opposite the optical sensing element with a potting compound.

29. The method of claim 18 further comprising:
coupling an electrical connector to electrical circuitry at the substrate,
wherein the electrical connector is configured such that when the side of the substrate opposite the optical sensing element is covered with a potting compound, the electrical connector extends through and is exposed for connection outside of the potting compound.

30. The method of claim 29 further comprising:
forming a cutout in a portion of the hollow casing, through which the electrical connector is exposed for connection when the electrical connector is coupled to the electrical circuitry at the substrate and the substrate is sealed against the one or more surfaces of the hollow casing.

31. The method of claim 18 further comprising:
physically coupling a microcontroller, one or more capacitors, and signal processing circuitry to the substrate.

32. The method of claim 31 wherein at least one of the microcontroller, the one or more capacitors, and the signal processing circuitry is coupled to an opposite side of the substrate from the optical sensing element.

33. The method of claim 18 wherein the substrate is a printed circuit board.

34. The method of claim 18 wherein the optical sensing element is a thermopile sensor array.

35. The method of claim 18 wherein the substrate is coupled to a panel that includes a plurality of similar substrates, the method further comprising:

separating the substrate from the panel.

* * * * *